(12) United States Patent
Joet et al.

(10) Patent No.: US 9,910,073 B2
(45) Date of Patent: Mar. 6, 2018

(54) MEASUREMENT CIRCUIT (71) Applicant: COMMISSARIAT A L'ENERGIE ATOMIQUE ET AUX ENERGIES ALTERNATIVES, Paris (FR)

(72) Inventors: Loic Joet, Grenoble (FR); Franck Badets, Voiron (FR); Guillaume Jourdan, Grenoble (FR); Patrice Rey, St Jean de Moirans (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 302 days.

(21) Appl. No.: 14/687,501

(22) Filed: Apr. 15, 2015

(65) Prior Publication Data
US 2015/0293155 A1 Oct. 15, 2015

(30) Foreign Application Priority Data

Apr. 15, 2014 (FR) ..................... 14 53346

(51) Int. Cl.
*G01R 17/10* (2006.01)
*G01R 19/00* (2006.01)
*B81B 7/00* (2006.01)

(52) U.S. Cl.
CPC ............ *G01R 17/105* (2013.01); *B81B 7/008* (2013.01); *G01R 19/0084* (2013.01)

(58) Field of Classification Search
CPC .... G01R 17/105; G01R 19/0084; B81B 7/008
See application file for complete search history.

(56) References Cited

U.S. PATENT DOCUMENTS

2013/0000411 A1 1/2013 Robert et al.
2014/0331770 A1 11/2014 Jourdan et al.

FOREIGN PATENT DOCUMENTS

EP 2 541 222 A1 1/2013
WO WO 2013/087717 A1 6/2013

OTHER PUBLICATIONS

U.S. Appl. No. 11/576,991, filed Dec. 19, 2014, Guillaume Jourdan et al.

(Continued)

*Primary Examiner* — David M Gray
*Assistant Examiner* — Michael Harrison
(74) *Attorney, Agent, or Firm* — Oblon, McClelland, Maier & Neustadt, L.L.P.

(57) ABSTRACT

A measurement circuit for a sensor, the measurement circuit includes at least one detection branch including at least a first series of at least one dipole and a second series of at least one dipole, the series being connected in parallel and connected at their inputs to a common input terminal, each series of dipole being connected to a distinct output terminal, and an electronic circuit including a bias circuit configured to apply a bias current to the detection branch from the input terminal, and a read circuit configured to impose on each output terminal the same potential referred to as the "reference potential" ($V_{REF}$); the electronic circuit including a determination circuit for determining variations in impedances of each series of dipole of the detection branch on the basis of the current applied to each output terminal by the read circuit so as to keep the potentials equal.

25 Claims, 3 Drawing Sheets

(56) References Cited

OTHER PUBLICATIONS

French Preliminary Search Report dated Jan. 15, 2015 in French Application 14 53346, filed on Apr. 15, 2014 (with English Translation of Categories of Cited Documents and Written Opinion).
Ebrahim Farshidi "A Low-Voltage Current-Mode Wheatstone Bridge using CMOS Transistors", International Journal of Electrical and Electronics Engineering, Issue 1, vol. 5, Feb. 28, 2011, 5 pages.
Chaiya Tanaphatsiri et al. "A Current-Mode Wheatstone Bridge Employing Only Single DO-CDTA", Circuits and Systems, Nov. 30, 2008, 4 pages.
Sayed Javad Azhari et al. "AZKA Cell, the Current-Mode Alternative of Wheatstone Bridge", IEEE Transactions on Circuits and Systems Part I: Regular Papers, vol. 47, No. 9, Sep. 1, 2000, 8 pages.
Karl F. Anderson The Anderson Loop: NASA's Successor to the Wheatstone Bridge, Jul. 16, 1998, 9 pages.

MEASUREMENT CIRCUIT

FIELD OF THE INVENTION

The present invention relates to the microelectronics industry, which covers not only microelectronics techniques but also nanoelectronics techniques. In particular, the invention relates to a measurement circuit for a sensor, designed in particular for a microelectromechanical system or "MEMS" and/or a nanoelectromechanical system or "NEMS".

TECHNOLOGICAL BACKGROUND

The consumer market for sensors is tending towards ever smaller component sizes in order to achieve prices that are competitive. However, measurement circuits for sensors are particularly complex because they require read electronics capable of detecting variations in impedances of dipole.

The impedances can be of the resistive type, as applies to piezoresistive strain gauges, and thermistors, of the capacitive type (variation in capacitance by variation in surface area or in airgap) or indeed of the inductive type. The measurement circuit needs to be configured to co-operate with passive sensors for microelectromechanical systems (MEMS) or nanoelectromechanical systems (NEMS), such as pressure sensors, temperature sensors, one-dimensional to three-dimensional accelerometers, one-dimensional to three-dimensional magnetometers, one-dimensional to three-dimensional gyrometers, and deformation or force sensors based on piezoresistive deformation gauges.

Passive sensors use various physical phenomena (piezoresistivity, photoresistivity, magnetoresistivity, variation in capacitance induced by variation in surface area or variation in airgap, etc.) to modify their impedances as a function of the value of the measurand that is to be evaluated (strain, deformation, displacement, light flux, magnetic field, etc.). Such sensors generally require a voltage or current source to bias the impedances of the dipole and thereby measure variation in them. For this type of circuit, it is necessary to use conditioners that encode the information, and more particularly to use potentiometer circuits.

In the state of the prior art, the solution that is most commonly used is the Wheatstone bridge. In the field of multi-axis sensors, a plurality of bridges need to be powered and read. In order to limit the number of terminals necessary for biasing and for reading, usually only a half Wheatstone bridge is formed by means of two variable impedances. The bridge is closed onto an electronic chip following the addition of two resistors having reference resistance.

For multi-axis reading, it is possible to share the power supply terminal. For such reading, it is possible to power and to read the bridges independently from one another. In certain situations, a single electronics circuit is put in place that has two functions: biasing and reading the bridges in successive manner.

However, one of the difficulties encountered for taking full advantage of the Wheatstone bridge is related to the connection parasitic resistances between the elements of the bridge and the external power supply circuits. The impact of the parasitic resistances can be minimized if their values are negligible compared with the resistances of the bridge for any given measurement precision. However, certain manufacturing techniques, such as using gold-silicon bonding (between the chip and its cap) can bring parasitic resistances of the same orders of magnitude as the resistances to be measured, such parasitic resistances not being known or controlled, and varying over time and with variations in temperature.

In such a situation, it is necessary to overcome such parasitic resistances so as not to disturb the measurement, in particular by using "four-point" or "four-terminal" connection techniques. The principle of that technique is to double the terminals serving for the power supply. The first terminal then serves to feed the current in. The current then causes a potential drop in the parasitic resistance, making the external potential different from the internal potential. However, that effect is of no consequence because the reading can then be taken on the second terminal. Since the reading involves only negligible currents, the internal and external potentials are the same.

In a "four-point" mode having one bridge, the measurement terminals are, in general, not doubled because the measurement electronics have very high impedance and the current flowing through them is very low. However, the voltage applied by the source cannot propagate fully to the bridge because of the voltage drop in the parasitic resistances. The number of terminals is thus doubled in order to be able to measure the voltage actually brought to the bridge. A read electronic circuit is necessary in order to measure the bias voltage.

In a second solution, the entire Wheatstone bridge has been placed at the MEMS chip and the number of terminals has been doubled, leading to a number of terminals that is prohibitive, in particular for a multi-axis sensor.

In addition, the document entitled "A Low-Voltage Current Mode Wheatstone Bridge using CMOS Transistors", by Farshidi et al., International Journal of Electrical & Electronics Engineering, Issue 1, vol. 5, pages 38-42, relates to a measurement circuit including a Wheatstone bridge. That document makes provision for the circuit to have a current output. Analog converters, for example, work exclusively in voltage. Thus, in that type of circuit, it is necessary to add a current-to-voltage conversion stage in order to transform the current output into a voltage output. A major drawback is therefore the complexity of the circuit and the high cost of forming such a circuit.

The present invention makes it possible to solve all, or at least some, of the drawbacks generated by the Wheatstone bridge method. The invention also proposes a measurement circuit that is simple and inexpensive, and that serves as an alternative to the Wheatstone bridge, while also overcoming all the drawbacks hitherto encountered.

SUMMARY OF THE INVENTION

The invention provides a measurement circuit for a sensor, the measurement circuit including at least one detection branch including at least a first series of at least one dipole and a second series of at least one dipole, the series being connected in parallel and connected at their inputs to a common input terminal; each series of dipole being connected to a distinct output terminal.

Advantageously, the electronic circuit includes a bias circuit configured to apply a bias current to said detection branch from the input terminal, and a read circuit including at least one voltage-controlled current source, configured to impose on each output terminal the same potential referred to as the "reference potential" ($V_{REF}$); said electronic circuit including a determination circuit for determining variations in impedances of each series of dipole of the detection branch on the basis of the current applied to each output terminal by the read circuit so as to keep the potentials equal; the determination circuit is configured to deliver as output a voltage signal that is proportional to the difference between the current at the output terminal of the first series of dipole and the current at the output terminal of the second series of dipole.

In particularly advantageous manner, the output of the circuit of the present invention is voltage output.

In accordance with the invention, the read circuit is an active circuit suitable for imposing an identical potential, referred to as the "reference potential", on each output terminal, which potential may be fixed or variable by applying distinct currents (but not necessarily different currents) to each output terminal.

The invention also provides a sensor including at least one measurement circuit.

The invention also provides a measurement method comprising use of a measurement circuit including at least one detection branch including at least a first series of at least one dipole and a second series of at least one dipole, the series being connected in parallel and connected at their inputs to a common input terminal; each series of dipole being connected to a distinct output terminal, and the method further comprising the following steps:
  applying a bias current to said detection branch from the input terminal;
  imposing on each output terminal the same potential, referred to as the "reference potential" ($V_{REF}$);
  determining variations in impedances of each series of dipole of the detection branch, by means of a determination circuit, on the basis of the current applied to each output terminal so as to keep the potentials equal; the determination circuit being configured to deliver as output a voltage signal that is proportional to the difference between the current at the output terminal of the first series of dipole and the current at the output terminal of the second series of dipole.

Advantageously, the measurement circuit of the present invention proposes an alternative to the Wheatstone bridge. In the present invention, the read electronics and the impedances of the series of dipole interact to guarantee a reference potential ($V_{REF}$) at the output terminals of said dipole. The present invention also makes it possible to avoid using resistors having reference resistance to supplement the bridge.

The invention also advantageously makes it possible to minimize the number of output terminals when the reading is performed on a plurality of detection axes. Furthermore, it is not necessary to measure the actual bias voltage. The impedances of the first and second series of dipole may be powered independently from each other in order to limit the bias consumption. The impedances can be read at the same time by the same electronics in order to increase performance.

BRIEF INTRODUCTION TO THE FIGURES

Other characteristics, objects, and advantages of the present invention appear more clearly from the detailed description of embodiments of the invention that are shown in the following accompanying drawings, in which.

The drawings are given by way of example and they are not limiting on the invention. They constitute diagrammatic representations showing principles and designed to facilitate understanding of the invention, and they are not necessarily to scale for the practical applications.

DETAILED DESCRIPTION

Before beginning a detailed review of the embodiments of the invention, optional characteristics are given below that may be used in association or in alternation:
  Advantageously, the circuit is configured to deliver as output a voltage signal that is proportional to the difference between the current at the output terminal of the first series of dipole and the current at the output terminal of the second series of dipole.
  Preferably, the determination circuit, forming determination means, is configured to guarantee equality between a first potential read at one of the output terminals and a second potential read at the other of the output terminals.
  The determination circuit preferably includes an amplifier configured in such a manner as to compare, at its input, the first and second potentials at each of the output terminals of said first and second series of dipole.
  The at least one amplifier is configured in such a manner as to generate at its output a voltage signal "out".
  The voltage signal at the output of the at least one amplifier is reinjected into the at least one voltage-controlled current source.
  Advantageously, the determination circuit is configured to guarantee equality between the potentials at each output terminal of said first and second series of dipole and the reference potential ($V_{REF}$), corresponding generally to the (fixed or variable) setpoint value determined by the user of the circuit.
  Preferably, the determination circuit is configured to apply (absorb or inject) a current to each output terminal of said first and second series of dipole. Advantageously, the determination circuit controls the absorption or the injection of the current.
  Advantageously, the determination circuit is configured to determine an average potential ($V_{average}$) equal to the average between the potential at the output terminal of the first series of dipole and the potential at the output terminal of the second series of dipole. Advantageously, the determination circuit includes a voltage divider bridge connected to each output terminal of said first and second series of dipole so as to deliver said an average potential ($V_{average}$).
  The determination circuit preferably includes an additional amplifier configured in such a manner as to compare the average potential ($V_{average}$) and the reference potential ($V_{REF}$).
  Advantageously, the determination circuit controls transconductors connected to the output terminals, each output terminal being connected to a distinct transconductor. The transconductors are voltage-controlled current sources.

Preferably, the circuit includes at least one dipole having impedance that is variable as a function of the variation in a measurand in at least one from among the first and second series of dipole of a detection branch.

The bias circuit preferably includes at least one current source or at least one voltage source.

The current source preferably includes transistors mounted as a current mirror circuit.

Advantageously, the bias circuit is configured to apply (by absorption or injection) a bias current to the detection branch, in particular at a given frequency. In an embodiment, a more complex signal, in particular a frequency weighted by a window, a sort of filtering, reduces the spectral spread of the signal. This applies in particular for intermittent biasing of a branch, or for reading the other branches, or for saving energy.

The circuit includes a plurality of detection branches.

The first series of dipole of each detection branch are all connected to a common first output terminal, and the second series of dipole of each detection branch are connected to a common second output terminal.

The bias circuit includes a single bias source for biasing the plurality of branches and a switch configured in such a manner as to apply a current to each of the detection branches successively.

The switch switches over from one detection branch to another at a predetermined switch-over frequency.

The bias circuit includes a bias source for each of the detection branches, and is configured to deliver alternating current to each of the detection branches.

The bias circuit includes frequency filtering means. In an embodiment in which the read circuit makes it possible to recover simultaneously the values of the currents applied to each detection branch, said read circuit further includes frequency filtering means for separating the various measured values.

The multi-sensorial sensor includes at least one measurement circuit.

The sensor includes a microelectromechanical system and/or a nanoelectromechanical system.

The microelectromechanical system and/or the nanoelectromechanical system includes at least one mobile mass.

In the description, a detection axis corresponds to a chain sensitive to a measurand. A measurand is an input physical magnitude or quantity that is transformed into an output other physical magnitude or quantity, such as, for example, an electrical signal. The physical quantities may, for example, be of the mechanical type (in particular displacement, force, mass, or flow rate), of the thermal type (in particular temperature, thermal capacity, or thermal flux), of the electrical type (current, voltage, load, impedance, or quantities relating to dielectrics), of the magnetic type (in particular magnetic field), of the radiative type (in particular visible light, X-rays, or microwaves), or indeed of the (bio-) chemical type (in particular humidity, or quantities relating to gases). A multi-sensor or multi-axis sensor corresponds to a system having a plurality of detection axes.

Figure 1:
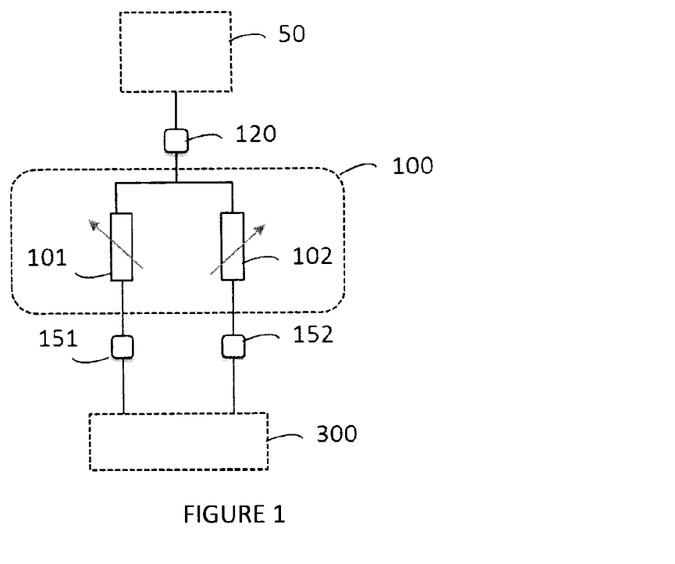
FIG. 1 is a diagram of the measurement circuit of the invention, the circuit comprising at least one detection branch, a bias circuit, and a read circuit.

FIG. 1 is a diagram of the measurement circuit of the invention. The measurement circuit comprises an electric circuit. The electric circuit comprises at least a bias circuit 50, a read circuit 300, and a detection branch 100 that is sensitive to at least one measurand.

The bias circuit 50 is configured in such manner as to impose a current or a potential on the common input terminal 120. The common input terminal 120 is connected to a detection branch 100. A detection branch 100 includes a first series 101 of dipole and a second series 102 of dipole. These series 101, 102 of dipole are mounted in parallel and are connected at their inputs to the common input terminal 120. The detection branch 100 is preferably in the form of a half-bridge of differential impedances to be measured. The first series 101 of dipole is connected at its output to a first output terminal 151. The second series 102 of dipole is connected to a second output terminal 152. The term "dipole" is used to mean an electrical component or network having two terminals. A general distinction can be made between two types of dipole. Active dipole deliver electric current, an example of such components being generators. Passive dipole receive electric current, an example of such components being receivers, as advantageously applies to the dipole of the series 101 and 102. Current-biasing offers a considerable advantage in the event of access parasitic resistances. This signal may be a direct current (DC) signal or an alternating current (AC) signal.

The read circuit 300 is configured in such a manner as to maintain the same reference potential ($V_{REF}$) at the first output terminal 151 and at the second output terminal 152. Advantageously, the read circuit includes a determination circuit for determining variation in impedance of each series 101, 102 of dipole of the detection branch 100 on the basis of the current applied to each output terminal 151, 152 by the read circuit in order to keep the potentials equal. The determination circuit includes determination means such as transconductors (voltage-controlled current sources), amplifiers, differential amplifiers, and dipole.

The output of the circuit is a signal proportional to the difference between the two currents at each output terminal 151, 152. This difference corresponds to a variation in the impedances in the first and second series 101, 102 of dipole. The impedances of the dipole of the first and second series of dipole 101, 102 are preferably biased. Preferably, the series 101, 102 of dipole are variable-resistance resistors (i.e. resistors having electrical resistance that varies).

By means of the common potential kept at the output of the impedances of the first and second series 101, 102 of dipole by the read circuit 300, the bias current applied to each of the series 101, 102 of dipole, reacts as if the impedances were in parallel.

In particularly advantageous manner, the measured current difference is directly proportional to the variation in the impedances.

In a conventional Wheatstone bridge, it is generally necessary to add reference-resistance resistors to close the bridge, and read electronics that are as discreet as possible so as not to disturb operation of the bridge.

In the present invention, the read circuit 300 replaces the reference-resistance resistors. The electronics feed back directly onto the impedances of the first and second series 101, 102 of dipole.

Figure 2A:
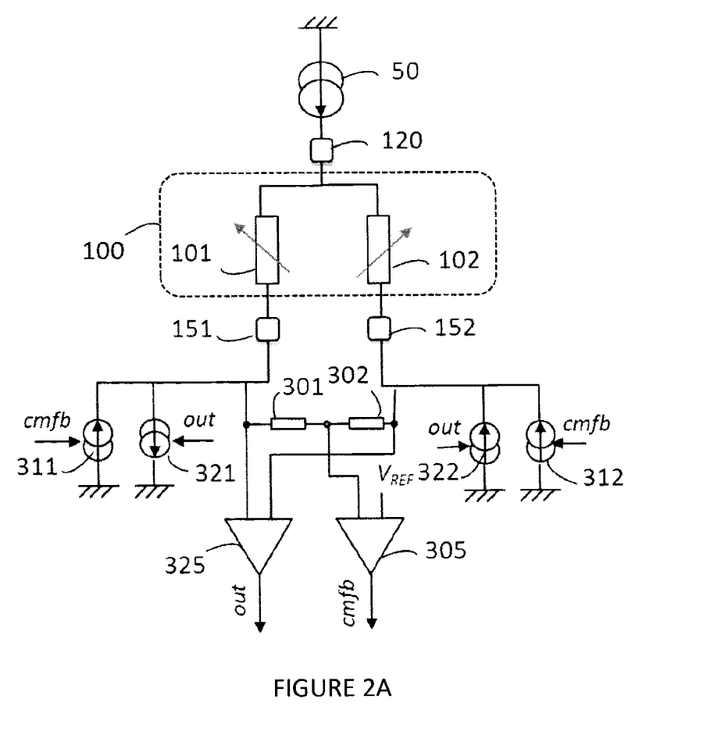
FIG. 2A is a diagram of the measurement circuit including a single detection branch and a read circuit including means for determining the variations of dipole; said dipole being positioned in said detection branch.

FIG. 2A shows a preferred but non-limiting embodiment of the invention. The bias circuit 50 may include a current source that is implementable, for example, by means of transistors, and in particular through a "current mirror" circuit.

The read circuit 300 is configured in such a manner as to maintain a potential that is common to the first output terminal 151 and to the second output terminal 152. The read circuit 300 includes a determination circuit suitable for absorbing or applying a current that is appropriate at said output terminals 151, 152. The determination means forming the determination circuit in part are configured in such manner as to deliver, at the output terminal referenced "out", a signal corresponding to a voltage proportional to the difference between the currents injected into the terminals 151, 152.

To this end, the read circuit 300 advantageously includes first and second loops; said loops, which are referred to as "servo-control" loops, include the determination means of the determination circuit.

The first loop is designed to guarantee an average potential as output, at the output terminals 151, 152 of the first and second series 101, 102 of dipole. The first loop includes a voltage divider bridge connected to each output terminal 151, 152. The term "voltage divider bridge" means an electronic circuit that enables an input voltage to be divided. In the context of the present invention, the input voltage is the potential difference between the output terminal 151 of the first series 101 of dipole and the output terminal 152 of the second series 102 of dipole. For example, this type of circuit is used to create a reference voltage. The voltage divider bridge preferably includes two resistors 301, 302 that are connected in series. Preferably, the two resistors 301, 302 have the same resistance value.

The voltage divider bridge makes it possible to recover an average potential $V_{Average}$ at the output terminals 151, 152 of the first and second series 101, 102 of dipole.

Advantageously, the first loop also includes an amplifier (or comparator) 305. "Amplifier or comparator" means a circuit making it possible to compare a variable voltage with a constant voltage. The amplifier 305 of the first loop of the circuit of the invention makes it possible to compare, at the input, the average potential $V_{MOY}$ at the output terminals 151, 152 of the first and second series 101, 102 of dipole with a reference potential $V_{REF}$. The reference potential ($V_{REF}$) preferably corresponds to a (fixed or variable) set-point value determined by the user. Advantageously, the amplifier 305 generates, at its output, a voltage signal referenced "cmfb" ("cmfb" being the abbreviation for "common mode feedback"). In a preferred but non-limiting embodiment, the voltage signal "cmfb" of the output of the amplifier 305 co-operates with transconductors 311, 312. Each of the transconductors 311, 312 is preferably connected to a different one of the output terminals 151, 152 of the first and second series 101, 102 of dipole. The transconductors 301, 302 may, preferably, be voltage-controlled current sources.

Advantageously, the first loop is configured in such a manner as to maintain an average potential Vaverage at the outputs of the impedances of the first and second series 101, 102 of dipole; said potential preferably being equal to a predetermined potential. The determination means of the first loop are preferably configured to apply one half of the bias current injected into each of the first and second series 101, 102 of dipole.

The second loop is designed to guarantee equal potentials at the output terminals 151, 152 of the first and second series 101, 102 of dipole. The potentials are compared through, for example, an amplifier 325, for which they form the input differential voltage. Advantageously, the amplifier 325 generates, at its output, a voltage signal referenced "out". In a preferred but non-limiting embodiment, the voltage signal "out" of the output of the amplifier 325 co-operates with transconductors 321, 322. It is possible to use operational amplifiers to implement the amplifiers 305, 325 of the invention. Each of the transconductors 321, 322 is preferably connected to a different one of the output terminals 151, 152 of the first and second series 101, 102 of dipole. The transconductors 321, 322 may, for example, be voltage-controlled current sources. In an embodiment, a first transconductor 321 is configured to apply a value of current to the output terminal 151 of the first series 101 of dipole whereas a second transconductor 322 is configured to apply said value of current to the output terminal 152 of the second series 102 of dipole.

Advantageously, under steady-state conditions, this second loop is suitable for maintaining equal potentials at the output terminals 151, 152 of the first and second series 101, 102 of dipole. At the output of the comparator 325, the signal is, in a particularly advantageous embodiment, proportional to the difference between the current at the output terminal 151 of the first series 101 of dipole, and the current at the output terminal 152 of the second series 102 of dipole. This signal represents the output of the circuit.

Figure 2B:
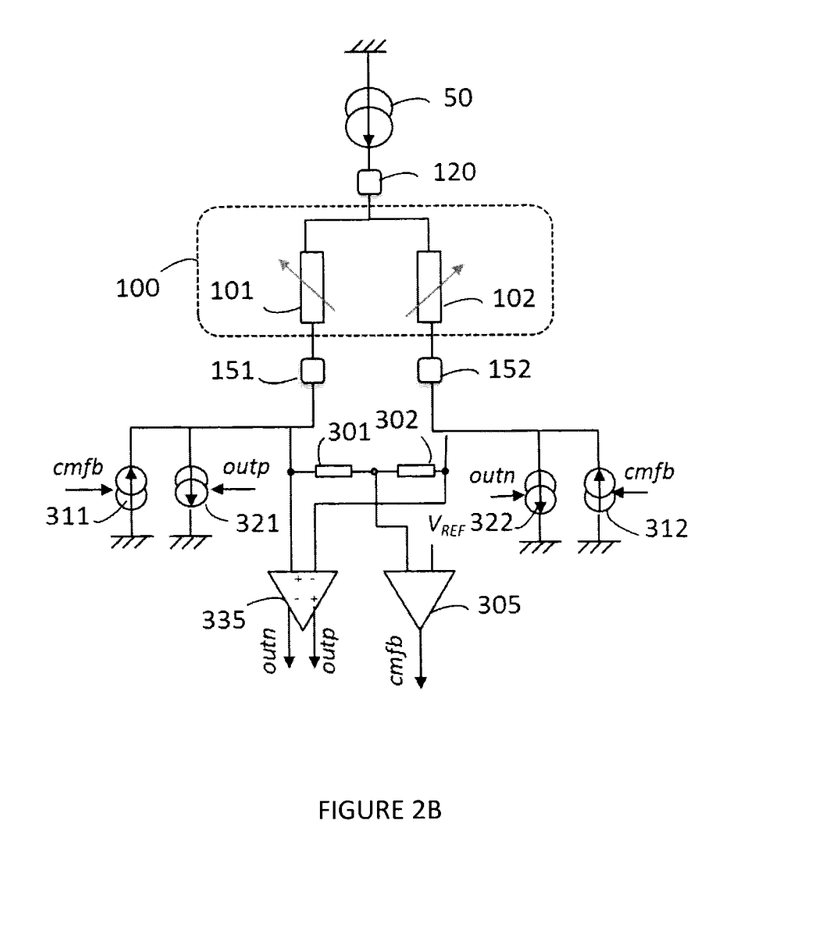
FIG. 2B is a diagram of a measurement circuit including a differential voltage output.

FIG. 2B shows an alternative to the embodiment shown in FIG. 2A. In this measurement circuit, a differential amplifier 335 is used.

The potentials are compared through, for example, an amplifier 325, for which they form the input differential voltage. Advantageously, the amplifier 335 generates, at its output, a first voltage signal referenced "outn" and a second output voltage signal referenced "outp". In a preferred but non-limiting embodiment, the first voltage signal "outn" of the output of the amplifier 335 co-operates with at least one first transconductor 321. Advantageously, the second voltage signal "outp" of the output of the amplifier 335 co-operates with at least one second transconductor 322.

In particularly advantageous manner, working in differential mode offers considerable advantages in terms of resistance to noise (in common mode), of linearity and of reduction of any offset observed in the output signal.

Figure 3:
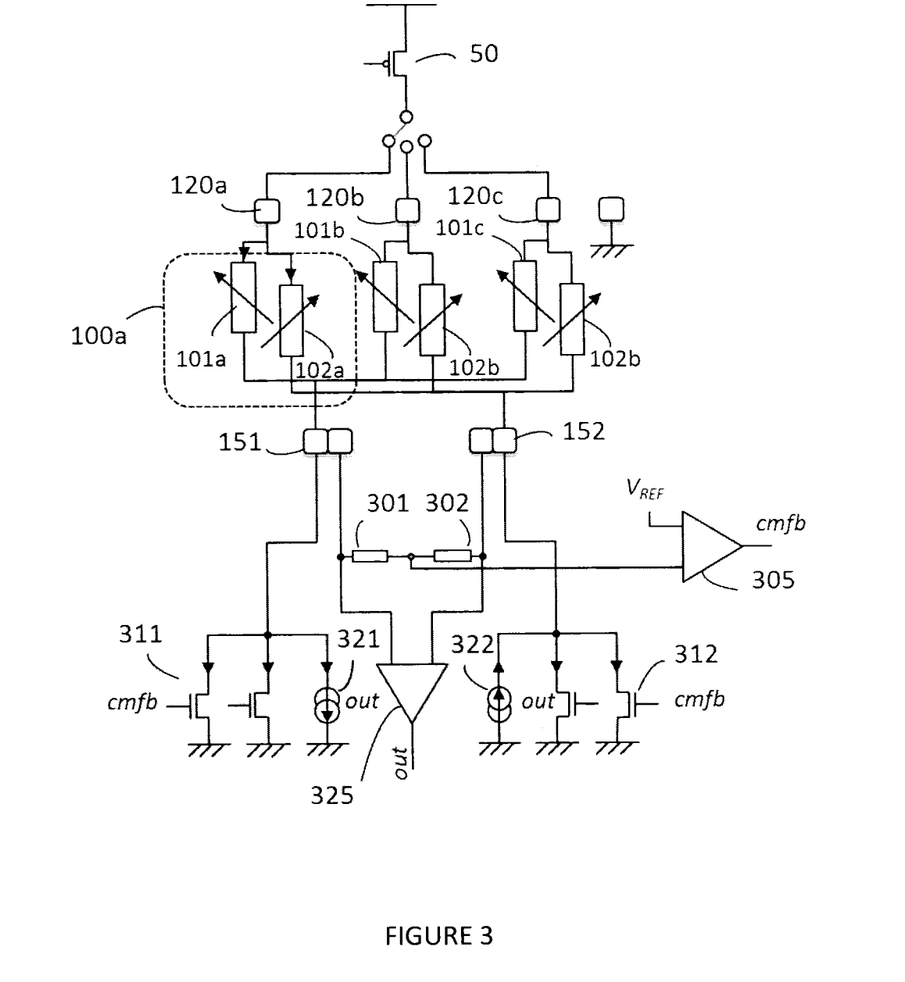
FIG. 3 is a diagram of the measurement circuit of the invention, including a plurality of detection branches, each of the detection branches having a distinct bias terminal. A switch connected to a bias source makes it possible to switch over between each of the bias terminals of the various branches.

FIG. 3 is a diagram of the measurement circuit of the invention, including a plurality of detection branches such as the branch referenced 100a in FIG. 3, each of the detection branches, of which there are three in FIG. 3, having a distinct biasing terminal 120a, 120b, 120c. In a preferred embodiment, a switch is connected to a bias source so as to switch over between each of the bias terminals 120a, 120b, 120c of the various detection branches.

In this embodiment in which the circuit includes a plurality of detection branches, each of said detection branches includes a first series 101a, 101b, 101c and a second series 102a, 102b, 102c of dipole. In this embodiment, the first series of dipole of each detection branch are all connected to a first output terminal 151, and the second series of dipole of each detection branch are connected to a second output terminal 152.

Advantageously, the sharing of the output terminals 151, 152 optimizes the compactness and make it possible, in particular, to reduce the number of terminals.

In a circuit configured as a Wheatstone bridge, it is impossible to pool the output terminals because the signals would mix instead of being superposed. It is only possible to pool the bias terminal, which limits the saving (still two output terminals per detection axis).

In the present invention, a single bias terminal 120a, 120b, 120c per detection axis is necessary. The higher the number of detection axis, the more advantageous the optimization of the number of terminals becomes.

In order to isolate the signal of each detection axis, it is necessary to separate them, for example, in time or indeed in frequency. In order to separate the signals in time, it is preferable to bias the detection branches one after another, without however superposing the signals. For frequency separation, it is possible to bias the detection branches simultaneously with currents, and preferably with alternating currents. Each of these currents has a specific frequency so that they can be dissociated by mixing and filtering. The invention makes it possible to measure all of the detection axes by using a single electronics circuit, giving preference to performance over bias consumption.

In the present invention, the output terminals 151, 152 are pooled and the bias terminals 120 are distinct. It is thus possible to choose to power only those detection axes that it is desired to power, thereby avoiding loss of current in the detection axes that are not read, and thereby limiting the potential drop at the output terminals 151, 152, in the event of access resistance at the terminals.

One of the advantages of the invention is, in an embodiment, to effect the addition of two terminals only, independently of the number of detection axes. More precisely, in order to overcome the effect of parasitic resistance, a "four-point" measurement is taken so as to double the output terminals 151, 152 of the read circuit 300 in order to dissociate the read functions and the feedback functions. Each of the terminals 151, 152 is then formed by a pair of elementary terminals. The first terminal in each pair of output terminals 151, 152 serves to read the potential. The associated electronic circuit, having very high impedance, consumes very little current, thereby limiting the uncontrolled voltage drops in the access parasitic resistances. The measurement is thus disturbed to only a very small extent. In addition, the feedback electronic circuit that absorbs non-negligible currents is subjected to uncontrolled voltage drops in the access parasitic resistances, but that is without any consequence because no reading takes place on the associated pair of terminals. Since the feedback of the first and second servo-control loops takes place in current, it is not sensitive to this defect.

In addition, by making provision for powering to be in current-mode, it is possible to control the bias while also keeping only one bias terminal 120 per detection axis. A potential drop might be observed at the access resistances. However, the bias source is advantageously configured in such a manner as to impose a current regardless of the impedance of the dipole. It is then advantageously no longer necessary to measure the actual bias voltage, as is done during a conventional "four-point" measurement.

In the present invention, the read electronic circuit and the impedances of the series of dipole 101, 102 interact in order to guarantee the same reference potential ($V_{REF}$) at the output terminals 151, 152 of said series of dipole 101, 102. The present invention also makes it possible to avoid using resistors having reference resistance to supplement the bridge. The invention advantageously makes it possible to minimize the number of output terminals 151, 152 for reading a plurality of detection axes. In addition, it requires only one additional input terminal per axis. During a "four-point" measurement, only two additional terminals are necessary, independently of the number of detection axes. It is not necessary to measure the actual bias voltage. The impedances of the first and second series 101, 102 of dipole may be powered independently of one another in order to limit the bias consumption. The impedances can be read at the same time by the same electronic circuit so as to increase performance.

The invention is not limited to the above-described embodiments, but rather it extends to any embodiment covered by the claims. In addition, the measurement circuit does not exclude the presence of other portions, including additional independent Wheatstone bridges.

The invention claimed is:

1. A measurement circuit for a sensor, the measurement circuit comprising:

at least one detection branch comprising at least a first series including at least one first dipole and a second series including at least one second dipole, the first series and the second series being connected in parallel, and connected at inputs thereof to a common input terminal, each of the first series and the second series being connected to a distinct output terminal;

an electronic circuit including a bias circuit configured to apply a bias current to the at least one detection branch from the common input terminal, and a read circuit, including at least one voltage-controlled current source configured to impose on each distinct output terminal a same reference potential; and a determination circuit configured to determine variations in impedances of said each of the first series and the second series on the basis of a current applied to said each distinct output terminal by the read circuit so as to keep a potential that is equal at said each distinct output terminal, the determination circuit being further configured to deliver as output a voltage signal that is proportional to a difference between a current at an output terminal of the first series and a current at an output terminal of the second series.

2. The measurement circuit according to claim 1, wherein the determination circuit is further configured to guarantee equality between a first potential read at the output terminals of the first series and a second potential read at the output terminal of the second series.

3. The measurement circuit according to claim 2, wherein the determination circuit includes at least one amplifier configured to compare, at an input thereof, the first potential and the second potential.

4. The measurement circuit according to claim 3, wherein the at least one amplifier is configured to generate at an output thereof an output voltage signal.

5. The measurement circuit according to claim 4, wherein the output voltage signal is reinjected into the at least one voltage-controlled current source.

6. The measurement circuit according to claim 1, wherein the determination circuit is further configured to apply a current to said each distinct output terminal of the first series and the second series.

7. The measurement circuit according to claim 1, wherein the determination circuit is further configured to determine an average potential equal to an average between a potential at the output terminal of the first series and a potential at the output terminal of the second series.

8. The measurement circuit according to claim 7, wherein the determination circuit further includes a voltage divider bridge connected to said each distinct output terminal of the first series and the second series, configured to deliver the average potential.

9. The measurement circuit according to claim 7, wherein the determination circuit further includes an amplifier configured to compare, at an input thereof, the average potential and the reference potential.

10. The measurement circuit according to claim 1, wherein the determination circuit further includes transconductors, said each distinct output terminal being connected to a distinct transconductor.

11. The measurement circuit according to claim 1, wherein at least one dipole of said at least one first dipole and said at least one second dipole has an impedance that is variable as a function of a variation in a measurand in at least one among the first series and the second series.

12. The measurement circuit according to claim 1, wherein the bias circuit includes at least one current source or at least one voltage source.

13. The measurement circuit according to claim 12, wherein the at least one current source includes transistors mounted as a current mirror circuit.

14. The measurement circuit according to claim 1, wherein the bias circuit is further configured to apply the bias current to the at least one detection branch at a predetermined frequency.

15. The measurement circuit according to claim 1, wherein the at least one detection branch includes a plurality of detection branches.

16. The measurement circuit according to claim 15, wherein the first series in each detection branch of the plurality of detection branches are all connected to a common first output terminal, and the second series in each detection branch of the plurality of detection branches are connected to a common second output terminal.

17. The measurement circuit according to claim 15, wherein the bias circuit includes a single bias source configured to bias the plurality of detection branches and a switch configured to apply current to said each detection branch of the plurality of detection branches successively.

18. The measurement circuit according to claim 17, wherein the switch switches over from one detection branch of the plurality of detection branches to another detection branch of the plurality of detection branches at a predetermined switch-over frequency.

19. The measurement circuit according to claim 15, wherein the bias circuit includes a bias source for each detection branch of the plurality of detection branches, and is further configured to deliver alternating current to said each detection branch of the plurality of detection branches successively.

20. The measurement circuit according to claim 1, wherein the read circuit includes a frequency filtering circuit.

21. A sensor including at least one measurement circuit according to claim 1.

22. The sensor according to claim 21, comprising a microelectromechanical system and/or a nanoelectromechanical system.

23. The sensor according to claim 22, wherein the microelectromechanical system and/or the nanoelectromechanical system includes at least one mobile mass.

24. The measurement circuit according to claim 10,
wherein said each distinct output terminal comprises a pair of elementary terminals,
wherein a first elementary terminal of said pair of elementary terminals is connected to the read circuit, and
wherein a second elementary terminal of said pair of elementary terminals is connected to a distinct transductor.

25. A measurement method, comprising:
providing a measurement circuit comprising at least one detection branch comprising at least a first series including at least one first dipole and a second series including at least one second dipole, the first series and the second series being connected in parallel, and connected at inputs thereof to a common input terminal, each of the first series and the second series being connected to a distinct output terminal;
applying a bias current to the at least one detection branch from the common input terminal;
imposing on each distinct output terminal a same reference potential; and
determining, by a determination circuit, variations in impedances of said each of the first series and the second series on the basis of a current applied with a voltage-controlled current source to said each distinct output terminal so as to keep a potential that is equal at said each distinct output terminal, the determination circuit being configured to deliver as output a voltage signal that is proportional to a difference between a current at an output terminal of the first series and a current at an output terminal of the second series.

* * * * *